United States Patent
Lin et al.

(10) Patent No.: US 12,417,902 B2
(45) Date of Patent: Sep. 16, 2025

(54) METHOD FOR CLEANING A CHAMBER

(71) Applicant: Lam Research Corporation, Fremont, CA (US)

(72) Inventors: Ran Lin, Fremont, CA (US); Wenbing Yang, Campbell, CA (US); Tamal Mukherjee, Fremont, CA (US); Jengyi Yu, San Ramon, CA (US); Samantha Siamhwa Tan, Newark, CA (US); Yang Pan, Los Altos, CA (US); Yiwen Fan, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 194 days.

(21) Appl. No.: 18/008,069

(22) PCT Filed: Jun. 8, 2021

(86) PCT No.: PCT/US2021/036417
§ 371 (c)(1),
(2) Date: Dec. 2, 2022

(87) PCT Pub. No.: WO2021/257328
PCT Pub. Date: Dec. 23, 2021

(65) Prior Publication Data
US 2023/0230819 A1    Jul. 20, 2023

Related U.S. Application Data

(60) Provisional application No. 63/039,303, filed on Jun. 15, 2020.

(51) Int. Cl.
*H01J 37/32*    (2006.01)
*C23F 4/00*    (2006.01)
(Continued)

(52) U.S. Cl.
CPC .......... *H01J 37/32862* (2013.01); *C23F 4/00* (2013.01); *H01J 2237/334* (2013.01); *H01L 21/02071* (2013.01); *H01L 21/32136* (2013.01)

(58) Field of Classification Search
CPC .......... H01J 37/32862; H01J 2237/334; H01J 37/32559; H01J 37/32853; C23F 4/00;
(Continued)

(56) References Cited

U.S. PATENT DOCUMENTS 6,926,014 B2    8/2005    Cheng et al.
7,662,235 B2    2/2010    Yoshida et al.
(Continued)

FOREIGN PATENT DOCUMENTS

JP    3-120368    5/1991
JP    11-186226    7/1999
(Continued)

OTHER PUBLICATIONS

English translation of KR-20090045529 A (Year: 2009), Shin et al, Method for etchign platinum and method for fabricating capacitor using the same, May 8, 2009.*
(Continued)

*Primary Examiner* — Anita K Alanko
(74) *Attorney, Agent, or Firm* — Beyer Law Group LLP

(57) ABSTRACT

A method for cleaning a plasma processing chamber comprising one or more cycles is provided. Each cycle comprises performing an oxygen containing plasma cleaning phase, performing a volatile chemistry type residue cleaning phase, and performing a fluorine containing plasma cleaning phase.

22 Claims, 7 Drawing Sheets

(51) Int. Cl.
*H01L 21/02* (2006.01)
*H01L 21/3213* (2006.01)

(58) Field of Classification Search
CPC ........ H01L 21/02071; H01L 21/32136; H10N 50/01
See application file for complete search history.

(56) References Cited

U.S. PATENT DOCUMENTS

| | | | |
|---|---|---|---|
| 10,256,108 B2 | 4/2019 | Fischer et al. | |
| 2004/0103914 A1* | 6/2004 | Cheng | H01J 37/32862 134/1.1 |
| 2006/0175011 A1 | 8/2006 | Shinriki et al. | |
| 2007/0163617 A1* | 7/2007 | Ozaki | H01J 37/32935 700/121 |
| 2015/0047680 A1* | 2/2015 | Umezaki | C23C 16/4405 134/37 |
| 2017/0213709 A1* | 7/2017 | Wu | C23F 4/00 |
| 2021/0001383 A1* | 1/2021 | Yamazaki | B08B 5/00 |
| 2021/0159089 A1* | 5/2021 | Suda | H01L 21/32137 |

FOREIGN PATENT DOCUMENTS

| | | | | |
|---|---|---|---|---|
| JP | 2005-101361 | | 4/2005 | |
| JP | 2006-237432 | | 9/2006 | |
| KR | 20090045529 A | * | 5/2006 | ....... H01L 21/32136 |
| KR | 2009-0045529 | | 5/2009 | |
| TW | 200410337 | | 6/2004 | |
| TW | 201738954 | | 11/2017 | |
| WO | 1998/001894 | | 1/1998 | |
| WO | 2020/072762 | | 4/2020 | |

OTHER PUBLICATIONS

International Search Report and Written Opinion for International Application No. PCT/US2021/036417 dated Sep. 29, 2021.
Taiwanese 1$^{st}$ Office Action from Taiwanese Application No. 110121373 dated Feb. 8, 2025 with Machine Translation.
Japanese Notice of Refusal from Japanese Application No. 2022-575707 dated Dec. 10, 2024 with Machine Translation.
Decision to Grant a Patent from Japanese Application No. 2022-575707 dated May 6, 2025 with Machine Translation.
Korean Office Action from Korean Application No. 10-2003-7000915 dated Jun. 17, 2025 with Machine Translation.

* cited by examiner

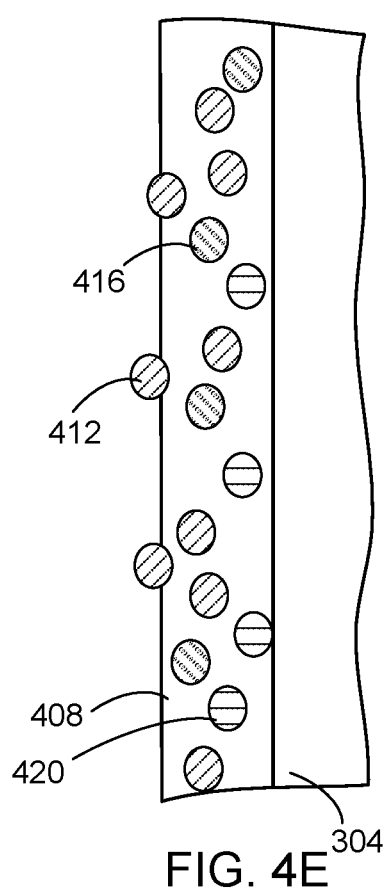
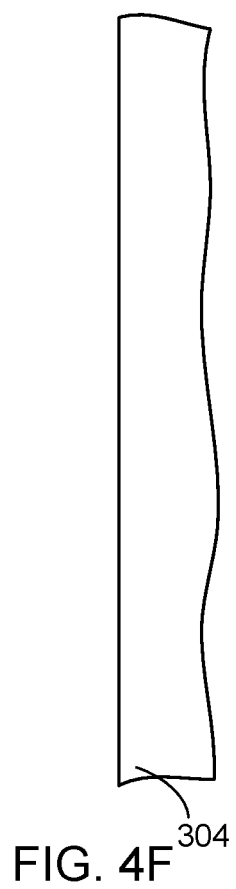
FIG. 4E
FIG. 4F

METHOD FOR CLEANING A CHAMBER

CROSS REFERENCE TO RELATED APPLICATION

This application claims the benefit of priority of U.S. Application No. 63/039,303, filed Jun. 15, 2020, which is incorporated herein by reference for all purposes.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

The present disclosure relates to methods of manufacturing of semiconductor devices. More specifically, the disclosure relates to methods for cleaning plasma processing chambers for manufacturing semiconductor devices.

Metal conductive paths exist widely in via holes and trenches, where a metal etch removes multiple types of active or inert metals to reveal circuit patterns. Beside interconnects, metal etch has critical applications in advanced memory devices. For example, patterning a wide variety of magnetic materials in a magnetoresistive random access memory (MRAM) stack remains challenging. Such stacks contain various metal containing layers. As a result of etching such stacks, various metal residues remain on plasma facing surfaces of plasma processing chambers after processing.

Plasma etching processes cause an accumulation of metal residues on plasma facing surfaces of plasma processing chambers. An effective metal cleaning procedure is needed for cleaning multiple etching species including metals in both metallic and compound form, and silicon species from a wafer or mask materials. Contaminants on chamber wall surfaces will cause severe production issues.

Therefore, an effective chamber clean process becomes critical to improve productivity. Current sequential cleaning processes have multiple issues that remain critical and prohibit chamber cleaning efficacy.

SUMMARY

To achieve the foregoing and in accordance with the purpose of the present disclosure, a method for cleaning a plasma processing chamber comprising one or more cycles is provided. Each cycle comprises performing an oxygen containing plasma cleaning phase, performing a volatile chemistry type residue cleaning phase, and performing a fluorine containing plasma cleaning phase.

In another embodiment, a method for processing a plurality of process wafers in a plasma processing chamber, comprising a plurality of cycles is provided. Each cycle comprises processing a process wafer of the plurality of process wafers in the plasma processing chamber and cleaning the plasma processing chamber, comprising an oxygen containing plasma phase, a volatile chemistry type residue cleaning phase, and a fluorine containing plasma phase.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which:

FIGS. 4A-F are enlarged schematic cross-sectional views of part of a plasma processing chamber.

DETAILED DESCRIPTION OF THE PREFERRED EMBODIMENTS

Figure 1:
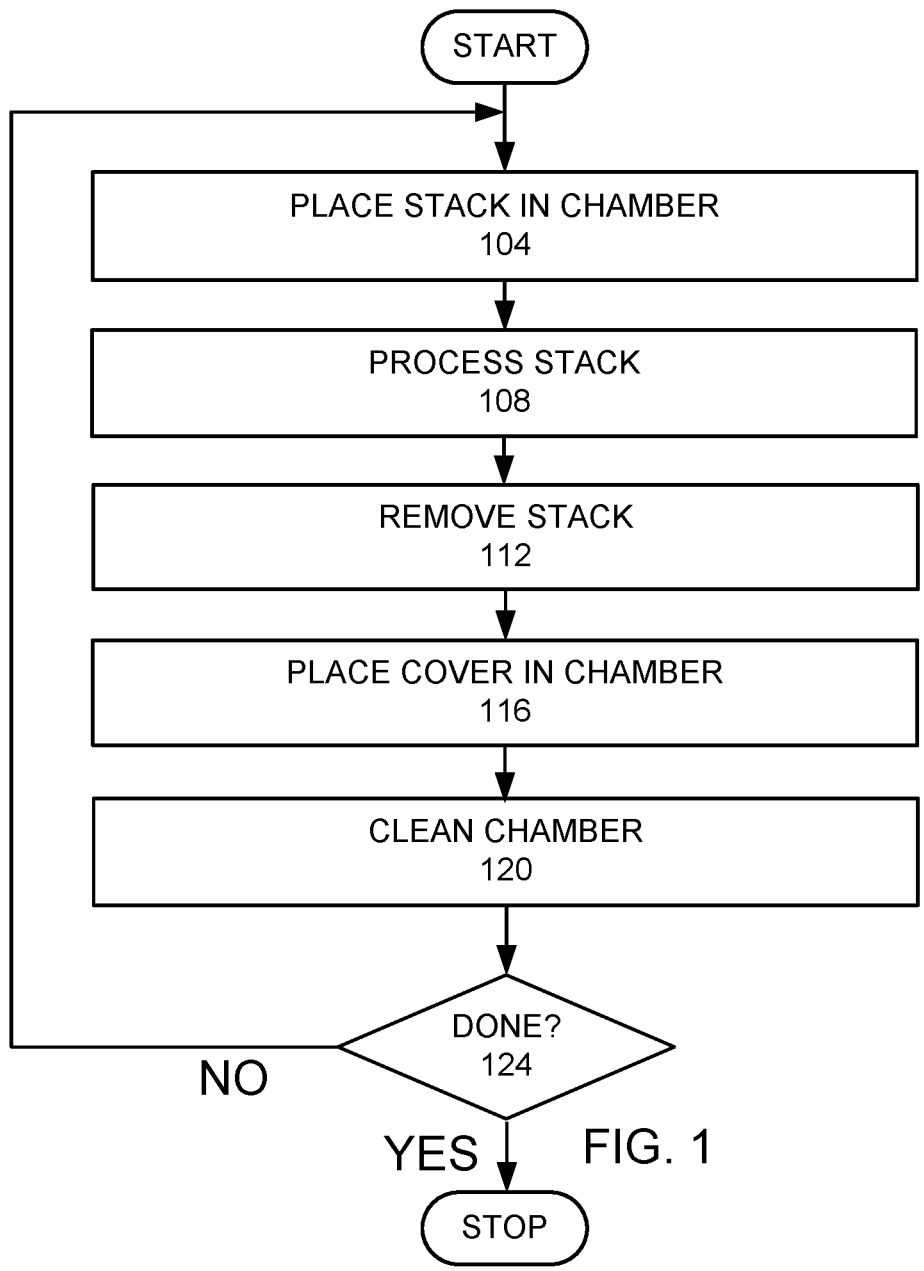
FIG. 1 is a high level flow chart of an embodiment.

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Metal conductive paths exist widely in via holes and trenches, where a metal etch removes multiple types of active or inert metals to reveal circuit patterns. Besides interconnects, metal etch has critical applications in advanced memory devices. For example, patterning a wide variety of magnetic materials in magnetoresistive random access memory (MRAM) stack remains challenging, when such a stack contains titanium nitride (TiN), ruthenium (Ru), copper-iron-boron alloy (CoFeB), magnesium oxide (MgO), cobalt platinum (CoPt), platinum manganese (PtMn), and possibly other metal containing layers. Metal residues remaining on a chamber wall after various processes include cobalt (Co), iron (Fe), boron (B), platinum (Pt), tantalum (Ta), ruthenium (Ru), molybdenum (Mo), titanium (Ti), manganese (Mn), magnesium (Mg), palladium (Pd), chromium (Cr), iridium (Ir), nickel (Ni), tungsten (W), copper (Cu) and aluminum (Al), etc.

After a metal plasma etch, the process chamber wall is contaminated with multiple etching species including metals in both metallic and compound form, and silicon species from process wafer or mask materials. Contaminants on the chamber wall will cause severe issues in IC fabrication by affecting chamber plasma conditions and thus wafer-to-wafer repeatability. For etching most metals in an MRAM magnetic tunnel junction (MTJ), halogen chemistry is applied to assess the etching efficacy. Metals are redeposited on chamber walls during wafer processing. X-ray photo-electron spectroscopy analysis of chamber wall surfaces reveals metals are mostly in compound form, such as metal fluoride (MFx, M: metal). In addition, the chamber wall surface is also coated with silicon oxide layers from the process wafer, hard mask materials, or etching chemicals. A mixture of metal/metal compounds and silicon oxide form contamination layers inside the chamber. This contamination results in several issues including flaking off of metal particles onto wafers and process drifts by releasing multiple atoms from the chamber wall during wafer processing.

Therefore, an effective chamber clean process becomes critical to improve productivity. Currently, a series of metal cleaning chemistries are developed to remove specific metal species, such as using an oxygen ($O_2$) plasma to remove Ru, a hydrogen gas ($H_2$) plasma to remove platinum dioxide ($PtO_2$), and a $Cl_2/H_2$ chemistry to remove Co and Fe, etc. A more comprehensive strategy for contamination elimination is applying cover-wafer-auto-clean (CWAC) post etch wafer process for in time chamber clean. This CWAC process contains sequential steps of chlorine gas ($Cl_2$), hydrogen gas ($H_2$), nitrogen trifluoride ($NF_3$), and $O_2$, etc. $Cl_2$ plasma is applied to remove metallic metal or metal oxides by forming $MCl_x$ (M: metal). $H_2$ can eliminate halogen residues and assist in the removal of $MF_x$ and $MCl_x$. $NF_3$ reacts with silicon oxides to decrease coating materials, and metals can be oxidized into metal oxides to prevent particles from flaking off. However, for current sequential CWAC processes, multiple issues remain critical and prohibit chamber cleaning efficacy: (i) a variety of metals in current IC devices cannot form volatile species with $Cl_2$ chemistry, such as Fe, Co, Pt, copper (Cu), etc, (ii) metal contaminants are embedded into a silicon oxide coating layer. The silicon oxide coating layer causes limited reactants with metal removal chemicals, (iii) $NF_3$ burning benefits exposing fresh metal contaminants by removing the silicon oxide coating, but possess low efficacy in forming volatile metal species. Inductively coupled plasma mass spectroscopy (ICPMS) analysis demonstrated high metal contamination levels after such a sequential CWAC process.

Figure 2A:
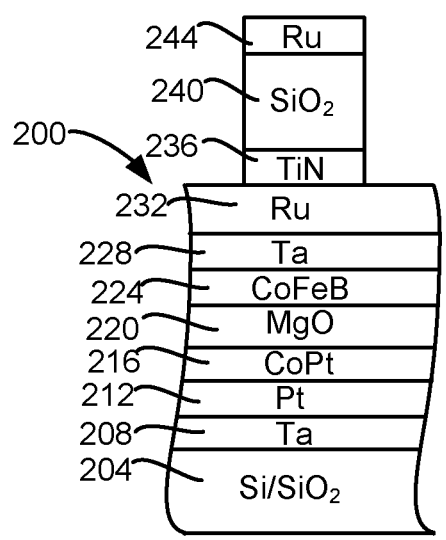
FIGS. 2A-B are schematic cross-sectional views of a stack processed according to an embodiment.

To facilitate understanding, FIG. 1 is a high level flow chart of a process used in an embodiment. A process wafer with a stack is placed in a plasma processing chamber (step 104). FIG. 2A is a schematic cross-sectional view of a stack 200 on a process wafer that is processed in an embodiment. The stack 200 is on a substrate with a silicon or silicon oxide ($Si/SiO_2$) layer 204. A first tantalum (Ta) layer 208 is over the $Si/SiO_2$ layer 204. A platinum (Pt) layer 212 is over the first Ta layer 208. A cobalt platinum alloy (CoPt) layer 216 is over the Pt layer 212. A magnesium oxide (MgO) layer 220 is over the CoPt layer 216. A cobalt iron boron (CoFeB) layer 224 is over the MgO layer 220. A second Ta layer 228 is over the CoFeB layer 224. A ruthenium (Ru) layer 232 is over the second Ta layer 228. A patterned mask is formed over the stack 200. In this embodiment, the patterned mask comprises a titanium nitride layer 236, under a $SiO_2$ layer 240, under a Ru layer 244.

Figure 2B:
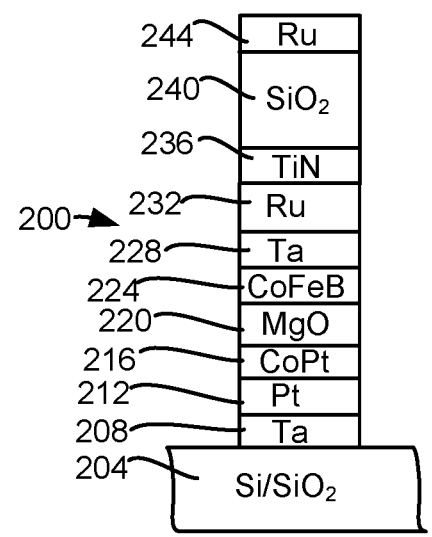

The stack 200 is processed (step 108). In this example, the stack is subjected to one or more etch processes to etch the stack. FIG. 2B is a schematic cross-sectional view of the stack 200 after the processing of the stack 200 is completed. The processing of the stack has etched the first Ta layer 208, the Pt layer 212, the CoPt layer 216, the MgO layer 220, the CoFeB layer 224, the second Ta layer 228, and the Ru layer 232. Some of the patterned mask may also be etched. As a result of the processing of the stack 200, Ru, $SiO_2$, TiN, CoFeB, MgO, CoPt, Pt, and Ta is deposited on plasma facing surfaces of the plasma processing chamber.

Figure 3:
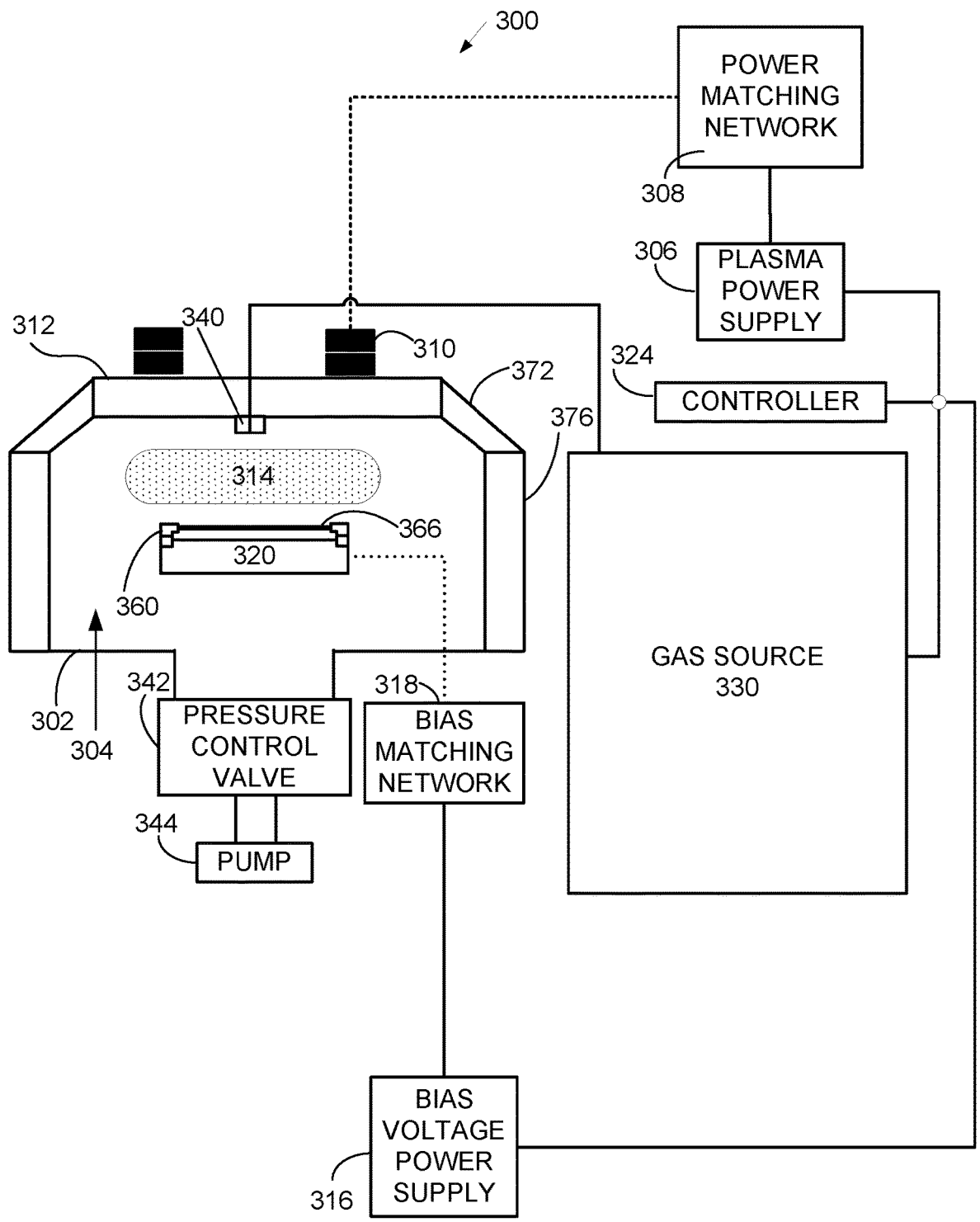
FIG. 3 is a schematic view of a plasma processing chamber that may be used in an embodiment.

The stack 200 is removed from the plasma processing chamber (step 112). A cover is placed in the plasma processing chamber (step 116). FIG. 3 schematically illustrates an example of a plasma processing chamber system 300 that may be used in an embodiment. The plasma processing chamber system 300 includes a plasma reactor 302 having a plasma processing chamber 304 therein. A plasma power supply 306, tuned by a power matching network 308, supplies power to a transformer coupled plasma (TCP) coil 310 located near a dielectric inductive power window 312 to create a plasma 314 in the plasma processing chamber 304 by providing an inductively coupled power. A pinnacle 372 extends from a chamber wall 376 of the plasma processing chamber 304 to the dielectric inductive power window 312 forming a pinnacle ring. The pinnacle 372 is angled with respect to the chamber wall 376 and the dielectric inductive power window 312. For example, the interior angle between the pinnacle 372 and the chamber wall 376 and the interior angle between the pinnacle 372 and the dielectric inductive power window 312 may each be greater than 90° and less than 180°. The pinnacle 372 provides an angled ring near the top of the plasma processing chamber 304, as shown. The TCP coil (upper power source) 310 may be configured to produce a uniform diffusion profile within the plasma processing chamber 304. For example, the TCP coil 310 may be configured to generate a toroidal power distribution in the plasma 314. The dielectric inductive power window 312 is provided to separate the TCP coil 310 from the plasma processing chamber 304 while allowing energy to pass from the TCP coil 310 to the plasma processing chamber 304. A wafer bias voltage power supply 316 tuned by a bias matching network 318 provides power to an electrode 320 to set the bias voltage when a stack is placed on the electrode 320. A cover 366 is placed over the electrode 320. In this embodiment, the cover 366 is a bare silicon wafer. A controller 324 controls the plasma power supply 306 and the wafer bias voltage power supply 316.

The plasma power supply 306 and the wafer bias voltage power supply 316 may be configured to operate at specific radio frequencies such as, for example, 13.56 megahertz (MHz), 27 MHz, 2 MHz, 60 MHz, 400 kilohertz (kHz), 2.54 gigahertz (GHz), or combinations thereof. Plasma power supply 306 and wafer bias voltage power supply 316 may be appropriately sized to supply a range of powers in order to achieve desired process performance. For example, in one embodiment, the plasma power supply 306 may supply the power in a range of 50 to 5000 Watts, and the wafer bias voltage power supply 316 may supply a bias voltage of in a range of 20 to 2000 volts (V). In addition, the TCP coil 310 and/or the electrode 320 may be comprised of two or more sub-coils or sub-electrodes. The sub-coils or sub-electrodes may be powered by a single power supply or powered by multiple power supplies.

As shown in FIG. 3, the plasma processing chamber system 300 further includes a gas source/gas supply mechanism 330. The gas source 330 is in fluid connection with plasma processing chamber 304 through a gas inlet, such as a gas injector 340. The gas injector 340 may be located in any advantageous location in the plasma processing chamber 304 and may take any form for injecting gas. Preferably, however, the gas inlet may be configured to produce a "tunable" gas injection profile. The tunable gas injection profile allows independent adjustment of the respective flow of the gases to multiple zones in the plasma process chamber 304. More preferably, the gas injector is mounted to the dielectric inductive power window 312. The gas injector may be mounted on, mounted in, or form part of the power window. The process gases and by-products are removed from the plasma process chamber 304 via a pressure control valve 342 and a pump 344. The pressure control valve 342 and pump 344 also serve to maintain a particular pressure within the plasma processing chamber 304. The pressure control valve 342 can maintain a pressure of less than 1 torr during processing. An edge ring 360 is placed around a top part of the electrode 320. The gas source/gas supply mechanism 330 is controlled by the controller 324. A Kiyo by Lam Research Corp. of Fremont, CA, may be used to practice an embodiment.

Figure 4A:
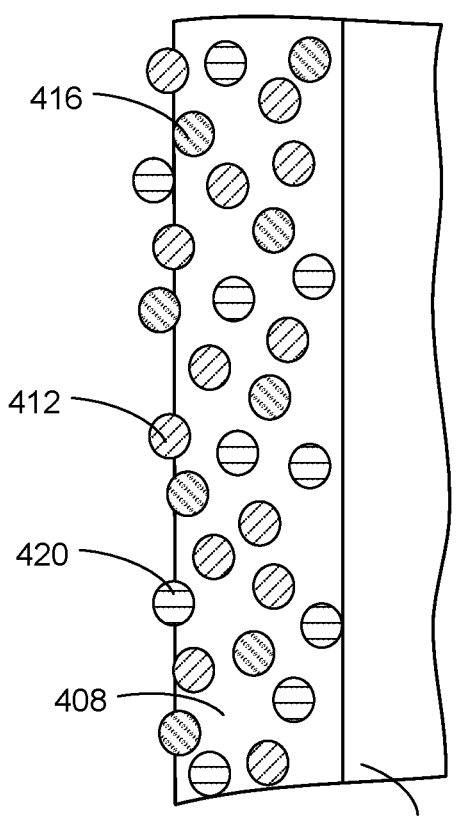

FIG. 4A is an enlarged cross-sectional view of part of the plasma processing chamber 304. In this embodiment, processing the stack 200 causes a silicon oxide ($SiO_2$) containing residue layer 408 to deposit on surface facing parts of the plasma processing chamber 304. In this embodiment, Ru containing residue 412, volatile chemistry type residue 416, such as iron and/or cobalt containing residues, metal halide type residue 420, such as titanium and/or tin containing residues are deposited and embedded in the $SiO_2$ containing residue layer 408.

Figure 5:
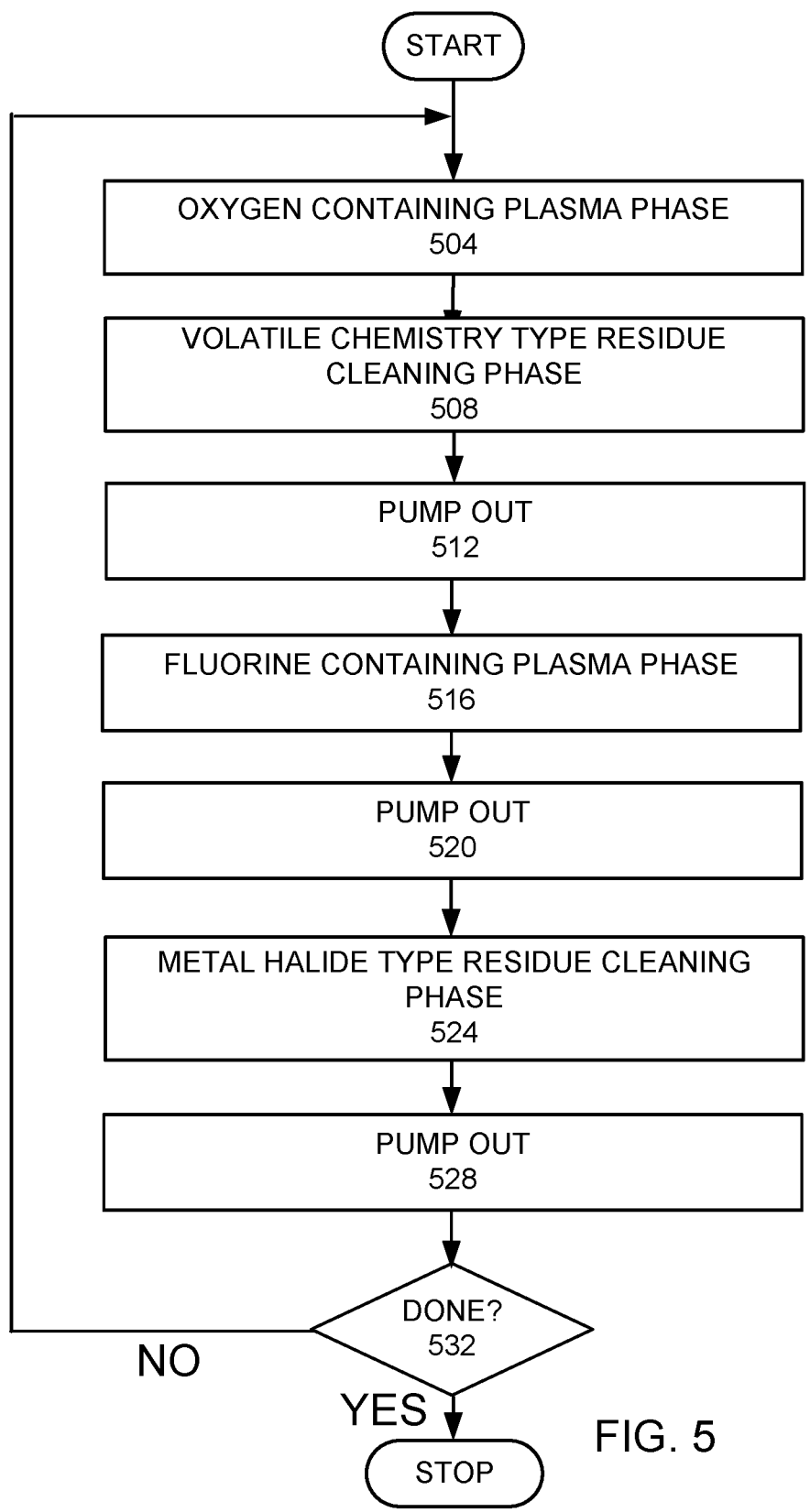
FIG. 5 is a more detailed flow chart of a cleaning step used in an embodiment.

After the cover 366 is placed in the plasma processing chamber 304 (step 116) the plasma processing chamber 304 is cleaned (step 120). FIG. 5 is a more detailed flow chart of the process of a cyclical process for cleaning the plasma processing chamber 304 (step 120) in this embodiment. First, an oxygen containing plasma phase is provided (step 504). In this embodiment, the oxygen containing gas comprises pure oxygen gas ($O_2$). In other embodiments, the oxygen containing gas may comprise one or more of $O_2$, ozone ($O_3$), carbon monoxide (CO), carbon dioxide ($CO_2$), and water ($H_2O$). The oxygen containing gas is transformed into a plasma. In this embodiment, the RF generator power is above 500 watts (W) at a frequency of 13.5 megahertz (MHz). The plasma causes some metals to form into metal oxides. For example, ruthenium oxide, iron oxide, and cobalt oxide may be formed. The ruthenium oxide may be ruthenium(IV) oxide or ruthenium(VIII) oxide. Chemical reactions for forming these example oxides may be: $Ru+O_2 \rightarrow RuOx$, $Co+O_2 \rightarrow CoOx$, $Fe+O_2 \rightarrow FeOx$, respectively. Some of the ruthenium oxide becomes volatile during the oxygen containing plasma phase and is removed. Converting some metals such as iron to iron oxide and cobalt to cobalt oxide allows for easier removal of iron and cobalt in later steps. The flow of the oxygen containing gas is stopped ending the oxygen containing plasma phase (step 504).

Figure 4B:
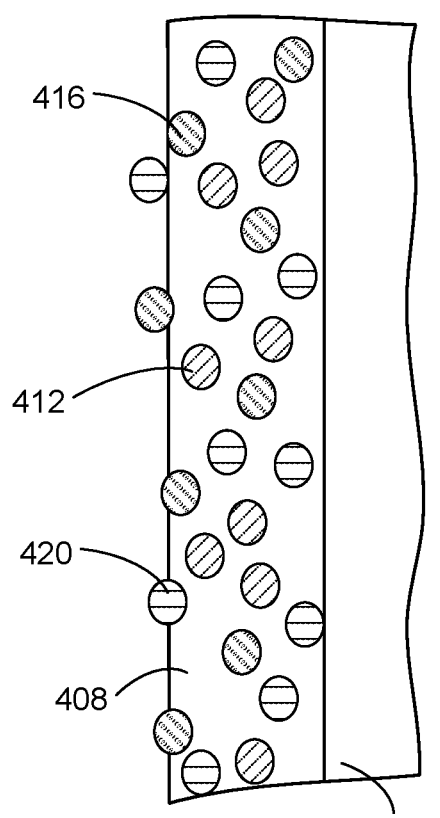

FIG. 4B is an enlarged cross-sectional view of part of the plasma processing chamber 304 after the oxygen containing plasma phase (step 504) is completed. Some of the Ru containing residue 412 is formed to ruthenium oxide and is removed. Some of the Ru containing residue 412 is embedded too far in the $SiO_2$ containing residue 408 and is not removed.

After the oxygen containing plasma phase (step 504) is completed, a volatile chemistry type residue cleaning phase is provided (step 508). In this embodiment, a chlorine containing gas is flowed into the plasma processing chamber 304. In this embodiment, the chlorine containing gas comprises $Cl_2$ and boron trichloride ($BCl_3$) gases. The chlorine containing gas is transformed into a plasma. In this embodiment, RF power is above 500 W, at a frequency of 13.5 MHz. The plasma causes some metals to form into metal chlorides. In this embodiment, Fe and Co are formed into volatile chlorides. The flow of the chlorine containing gas is then stopped.

In other embodiments, other methods of providing a volatile chemistry type residue cleaning phase (step 508) may be provided. Other halogen containing gases may comprise of at least one of phosphorus trifluoride ($PF_3$), phosphorus trichloride ($PCl_3$), $BCl_3$, silicon tetrachloride ($SiCl_4$), titanium tetrachloride ($TiCl_4$), and $Cl_2$. In another embodiment, a volatile chemistry gas comprising at least one of CO, $H_2O$, ammonia ($NH_3$), methanol (MeOH), and formic acid is provided. The volatile chemistry gas is formed into a plasma. The flow of the volatile chemistry gas is stopped. Some chemical reactions resulting from exposure to the plasma may include: $Co/CoO_x/CoF_x+PCl_3/PF_3 \rightarrow Co(PCl_3)_x/Co(PF_3)_x$, $Fe/FeO_x+SiCl_4 \rightarrow Fe(SiCl_x)_y$, $Mo+Cl_2 \rightarrow MoCl_x$, $FeO_x/CoO_x+MeOH \rightarrow Fe(CH_2O)_x/Co(CH_2O)_x$, $Fe/Co+CO \rightarrow Fe(CO)_x/Co(CO)_x$.

In another embodiment of a volatile chemistry type residue cleaning phase (step 508), a plasmaless thermal etch may be provided. In the thermal etch, the plasma processing chamber 304 is heated to a temperature above 100° C. In other embodiments, the plasma processing chamber 304 is heated to a temperature above 200° C. A ligand vapor with a carrier gas is flowed into the plasma processing chamber, where the ligand vapor forms a ligand complex with at least one of the metal containing residue, such as iron or cobalt or both. The ligand complex vaporizes at a temperature of at least 100° C. For example, a vapor comprising at least one of acetylacetone(acac) and Hexafluoroacetylacetone (hfac) is flowed into the plasma processing chamber 304. Acac and hfac combine with metals such as Co and Fe to form compounds such as $Fe(acac)_x$, $Fe(hfac)_x$, $Co(acac)_x$, and $Co(hfac)_x$. The heated plasma processing chamber 304 volatilizes at least one metal containing residue of the compounds. In other embodiments, the ligand vapor may comprise ligands of metal acetylacetonates or amidines. Metal acetylacetonates that may comprise at least one of $Sn(acac)_2$, $TiCl_2(acac)_2$, $Hf(acac)_4$, $Zn(acac)_2$. Amidines may comprise at least one of butylacetamidine, guanidine, and formamidine. The flow of the ligand vapor is then stopped.

Figure 4C:
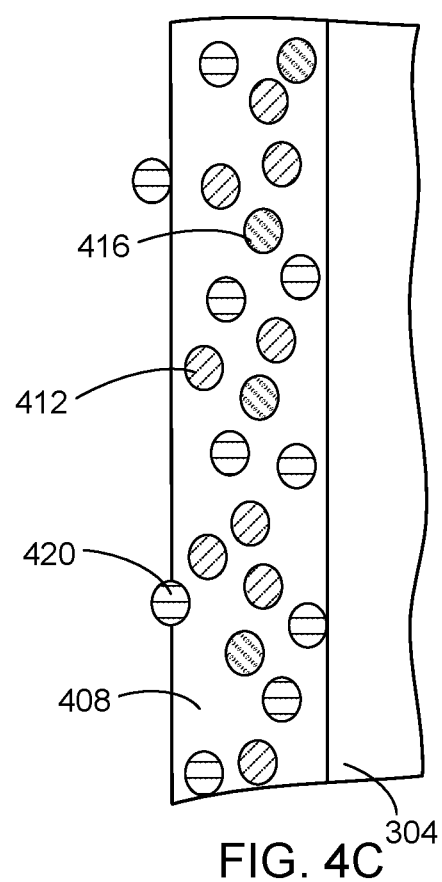

After the volatile chemistry type residue cleaning phase (step 508) is completed, a volatile chemistry type residue pump out phase is provided (step 512). The volatile chemistry type residue pump out phase may provide an inert gas, such as argon, and pump out the inert gas along with volatilized residues. In this embodiment, the volatile chemistry type residue pump out phase is plasmaless and may be used to pump out iron containing residue, cobalt containing residue, and other loose particles. FIG. 4C is an enlarged cross-sectional view of part of the plasma processing chamber 304 after the volatile chemistry type residue pump out phase (step 512) is completed. Some of the volatile chemistry type residue 416 is formed into a chloride and is removed. In this embodiment, the volatile chemistry type residue 416 are Mg, Ti, Mo, Cr, Co, and Fe containing residues. Iron oxide and cobalt oxide more readily react with chlorine than native metal iron and cobalt. So, oxidizing iron and cobalt helps to more easily remove iron and cobalt. In addition, loosened particles of other types of residues may be removed during the volatile chemistry type residue pump out phase.

After the volatile chemistry type residue pump out phase is completed (step 512), a fluorine containing plasma phase is provided (step 516). In this embodiment, the fluorine containing plasma phase (step 516) comprises first flowing a fluorine containing gas into the plasma processing chamber 304. In this embodiment, the fluorine containing gas comprises $NF_3$. In other embodiments, the fluorine containing gas may comprise one or more of $NF_3$, sulfur hexafluoride ($SF_6$), and carbon tetrafluoride ($CF_4$). The fluorine containing gas is transformed into a plasma. In this embodiment, RF power is above 500 W, at a frequency of 13.5 MHz. The plasma volatilizes some of the $SiO_2$ containing residue. The flow of the fluorine containing gas is stopped ending the fluorine containing plasma phase (step 516).

Figure 4D:
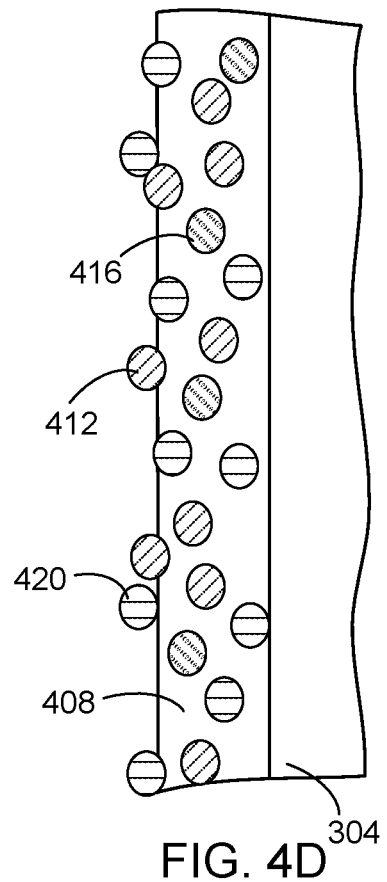

After the fluorine containing plasma phase (step 516) is completed, a fluorine residue pump out phase is provided (step 520). The fluorine containing pump out phase may provide an inert gas, such as argon, and pump out the inert gas along with volatilized residues. FIG. 4D is an enlarged cross-sectional view of part of the plasma processing chamber 304 after the fluorine containing pump out phase (step 520) is completed. Some of the $SiO_2$ containing residue 408 is removed. The removal and pump out of some of the $SiO_2$ containing residue 408 possibly remove some of the Ru containing residue 412, volatile chemistry type residue 416, and metal halide type residue 420.

After the fluorine containing pump out phase is completed (step 520), a metal halide type residue cleaning phase is provided (step 524). The metal halide type residue 420 is formed from metals formed into halides during the volatile chemistry type residue cleaning phase (step 508) and the fluorine containing plasma phase (step 516). In this embodiment, the metal halide type residue cleaning phase (step 524) comprises first flowing a hydrogen containing gas into the plasma processing chamber 304. In this embodiment, the hydrogen containing gas comprises pure $H_2$. In other embodiments, the hydrogen containing gas may comprise one or more of $H_2$, methane ($CH_4$), and $NH_3$. The hydrogen containing gas is transformed into a plasma. In this embodiment, RF power is above 500 W at a frequency of 13.5 MHz. The plasma volatilizes some of the metal halide type residue 420. The flow of the hydrogen containing gas is stopped ending the metal halide type residue cleaning phase (step 524).

After the metal halide type residue cleaning phase (step 524) is completed, a metal halide pump out phase is provided (step 528). The metal halide pump out phase may provide an inert gas, such as argon, and pump out the inert gas along with volatilized residues. FIG. 4E is an enlarged cross-sectional view of part of the plasma processing chamber 304 after the metal halide pump out phase (step 528) is completed. Some of the metal halide type residue 420 is removed. Some of the residue that is removed during this step are metal containing residues such as iron, cobalt, titanium, tin, and Si containing residues.

A determination is made whether or not to continue the process for another cycle (step 532). The cycle may be repeated until the plasma processing chamber 304 is sufficiently clean, for example meeting some threshold level of contamination. An in-situ endpoint sensor or some other sensor may be used to determine when the plasma processing chamber 304 is sufficiently clean. Since, in this example, residue remains on the plasma processing chamber 304, the process is repeated, going back to the oxygen containing plasma phase (step 504) one or more times. FIG. 4F is an enlarged cross-sectional view of part of the plasma processing chamber 304 after the cleaning of the plasma processing chamber 304 is completed (step 120).

After the plasma processing chamber 304 is cleaned (step 120), a determination is made whether or not to process another stack 200 (step 124). If another stack 200 is to be processed, then the process goes back to placing another stack 200 in the plasma processing chamber 304. The cycle may be repeated until all stacks 200 are processed. In instances where a plurality of stacks is to be processed, one or more cycles may be performed. For example, the cycle may be repeated after each stack is processed, or repeated after a predetermined number of stacks are processed, or repeated after a predetermined time period, etc. However, even in instances where only one stack 200 is processed, the cleaning as shown in FIG. 5 may be performed to clean the processing chamber, for example, to maintain the processing chamber in good condition.

By providing a cyclical process with the various cleaning steps, the mixture of many different metal containing residues and $SiO_2$ residue are cleaned from the plasma processing chamber 304, thus allowing the plasma processing chamber 304 to process each subsequent stack 200 with less contamination and less stack to stack drift.

In this embodiment, the cover 366 prevents redeposition of residues on the electrode 320. The cleaning process may generate particles that fall from the dielectric inductive power window 312. Without the cover 366, the particles will fall onto the electrode 320. By using a cover 366, the particles from the dielectric inductive power window 312 fall on the cover 366 and are removed when the cover 366 is removed. A substrate with a stack 200 is supported by and electrostatically chucked to the electrode 320. If residue is deposited on the electrode 320 or the surface of the electrode 320 is damaged by the cleaning, then the substrate might not be properly chucked and may dechuck during processing. This embodiment has been found to clean the dielectric inductive power window 312 in order to optimize the transmission of RF power through the dielectric inductive power window 312. If the dielectric inductive power window 312 is not sufficiently cleaned accumulation on parts of the plasma processing chamber 304, including the dielectric inductive power window 312, may reach a point where insufficient RF power is transmitted through the dielectric inductive power window 312 and the plasma fails to ignite.

Various embodiments may exclude one or more of the cleaning processes shown in FIG. 5, or may perform the processes in revised orders, and/or may include additional steps or processes. The specific order of the various cleaning steps helps provide a more efficient cleaning process. For example, the metal halide type residue cleaning phase (step 524) may be omitted. In another embodiment, the various pump outs may be omitted. However, the various pump outs help to remove particles before the particles fall to lower parts of the plasma processing chamber 304. During a particular step, a particle may be undercut and loosened before the particle is volatilized. Such loosened particles may drop to lower parts of the plasma processing chamber 304. The various pump outs may pump out such particles. In this embodiment, a pre-coat is not applied after cleaning the plasma processing chamber 304 (step 120) and before placing another stack in the plasma processing chamber 304 (step 104). Over time, residues may build up so that the plasma processing chamber 304 must be opened and reconditioned. Various embodiments significantly extend the time between such reconditioning and as a result, reduce downtime.

In various embodiments, the chlorine containing gas may comprise one or more of $Cl_2$, $BCl_3$, titanium tetrachloride ($TiCl_4$), silicon tetrachloride ($SiCl_4$), trichlorosilane ($SiHCl_3$), dichlorosilane ($SiH_2Cl_2$), chlorosilane ($SiH_3Cl$), and phosphorus trifluoride ($PF_3$) with phosphorus trichloride ($PCl_3$). In various embodiments, the ligand vapor may comprise at least one of acac, hfac, metal acetylacetonates, and amidines.

Figure 6:
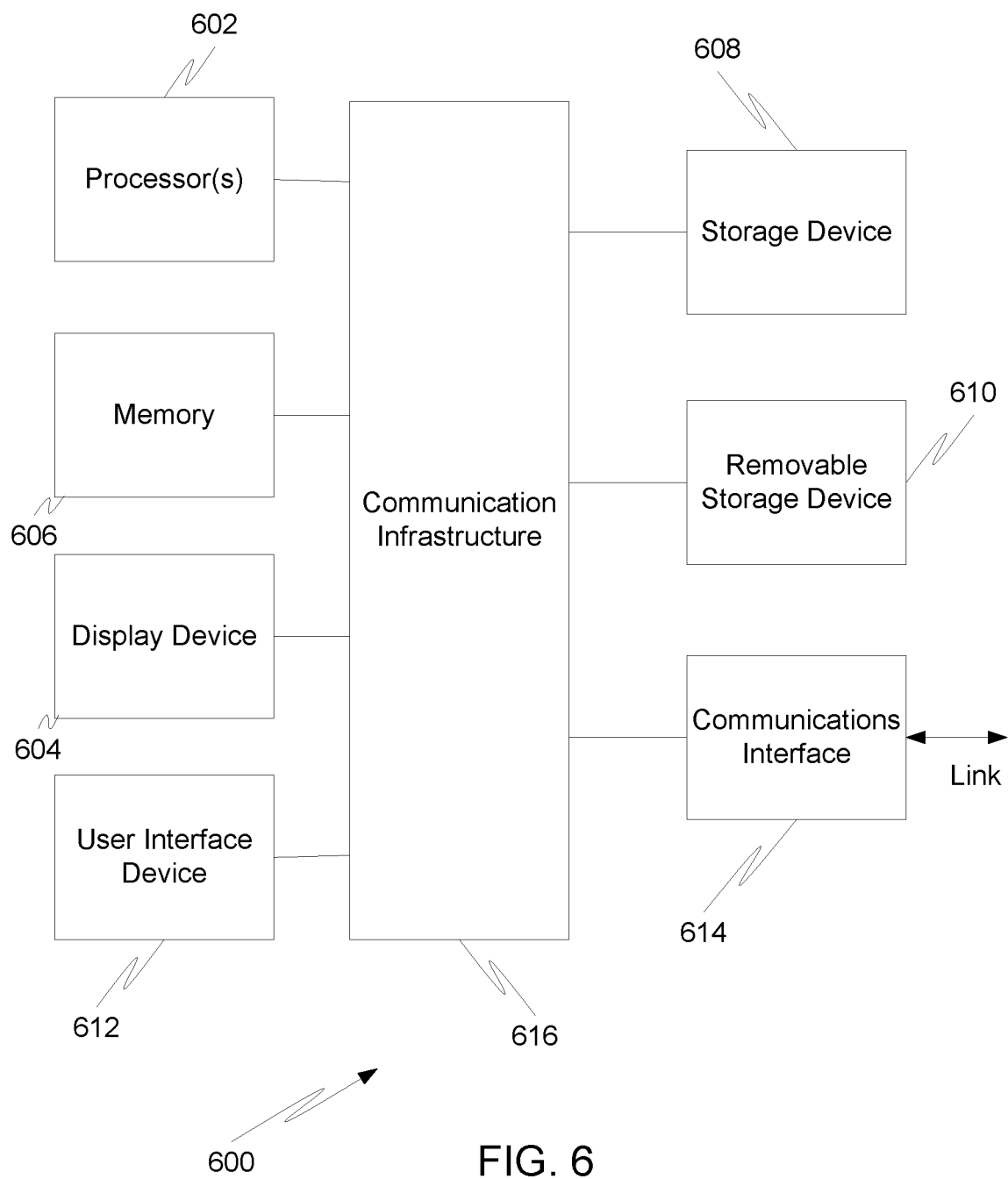
FIG. 6 is a computer system that may be used in an embodiment.

FIG. 6 is a high level block diagram showing a computer system 600 that is suitable for implementing a controller 324 used in embodiments. The computer system may have many physical forms ranging from an integrated circuit, a printed circuit board, and a small handheld device, up to a huge supercomputer. The computer system 600 includes one or more processors 602, and further can include an electronic display device 604 (for displaying graphics, text, and other data), a main memory 606 (e.g., random access memory (RAM)), storage device 608 (e.g., hard disk drive), removable storage device 610 (e.g., optical disk drive), user interface devices 612 (e.g., keyboards, touch screens, keypads, mice or other pointing devices, etc.), and a communication interface 614 (e.g., wireless network interface). The communication interface 614 allows software and data to be transferred between the computer system 600 and external devices via a link. The system may also include a communications infrastructure 616 (e.g., a communications bus, cross-over bar, or network) to which the aforementioned devices/modules are connected.

The information transferred via communications interface 614 may be in the form of signals such as electronic, electromagnetic, optical, or other signals capable of being received by communications interface 614, via a communication link that carries signals and may be implemented using wire or cable, fiber optics, a phone line, a cellular phone link, a radio frequency link, and/or other communication channels. With such a communications interface, it is contemplated that the one or more processors 602 might receive information from a network, or might output information to the network in the course of performing the above-described method steps. Furthermore, method embodiments may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

While this disclosure has been described in terms of several preferred embodiments, there are alterations, permutations, modifications, and various substitute equivalents, which fall within the scope of this disclosure. It should also be noted that there are many alternative ways of implementing the methods and apparatuses of the present disclosure. It is therefore intended that the following appended claims be interpreted as including all such alterations, permutations, and various substitute equivalents as fall within the true spirit and scope of the present disclosure. As used herein, the phrase A, B, or C should be construed to mean a logical (A OR B OR C), using a non-exclusive logical OR, and should not be construed to mean 'only one of A or B or C.

What is claimed is:

1. A method for cleaning a plasma processing chamber comprising one or more cycles, wherein each cycle comprises:
   i) performing an oxygen containing plasma cleaning phase:
   ii) performing a volatile chemistry type residue cleaning phase that removes metal containing residue containing at least one of cobalt, iron, palladium, platinum, and iridium, comprising:
      heating the plasma processing chamber to a temperature of at least 100° C.; and
      flowing a ligand vapor into the plasma processing chamber, wherein the ligand vapor forms a ligand complex with the at least one of cobalt, iron, palladium, platinum, and iridium, wherein the ligand complex vaporizes at a temperature of at least 100° C.; and
   iii) performing a fluorine containing plasma cleaning phase.

2. The method as recited in claim 1, wherein the cleaning is performed after processing a first wafer in the plasma processing chamber and before processing a second wafer in the plasma processing chamber.

3. The method as recited in claim 1, wherein a covering is placed in the plasma processing chamber before the cleaning.

4. The method as recited in claim 1, wherein the oxygen containing plasma cleaning phase comprises flowing an oxygen containing gas into the plasma processing chamber and forming the oxygen containing gas into a plasma.

5. The method as recited in claim 1, wherein the fluorine containing plasma cleaning phase comprises flowing a fluorine containing gas into the plasma processing chamber and forming the fluorine containing gas into a plasma.

6. The method, as recited in claim 1, wherein the cleaning the plasma processing chamber further comprises a metal halide residue cleaning phase after the fluorine containing plasma phase.

7. The method, as recited in claim 6, wherein the metal halide residue cleaning phase comprises:
   flowing hydrogen containing gas into the plasma processing chamber; and
   forming the hydrogen containing gas into a plasma.

8. The method, as recited in claim 6, wherein the metal halide residue cleaning phase further comprises a metal halide pump out.

9. The method as recited in claim 1, wherein the cleaning the plasma processing chamber further comprises a fluorine residue pump out phase after the fluorine containing plasma phase.

10. The method, as recited in claim 1, further comprising a volatile chemistry residue pump out phase after the volatile chemistry residue cleaning phase.

11. The method, as recited in claim 1, wherein the oxygen containing plasma phase volatilizes ruthenium containing residue and oxidizes metal containing residues, containing at least one of iron and cobalt forming at least one of iron oxide and cobalt oxide, and wherein the oxygen containing plasma cleaning phase is before performing the volatile chemistry residue cleaning phase and wherein the volatile chemistry residue cleaning phase is performed before the fluorine containing plasma cleaning phase.

12. The method, as recited in claim 1, wherein the volatile chemistry residue cleaning phase comprises:
   flowing a chlorine containing gas into the plasma processing chamber; and
   forming the chlorine containing gas into a plasma.

13. The method, as recited in claim 12, wherein the chlorine containing gas comprises (i) $Cl_2$, $BCl_3$, $TiCl_4$, $SiCl_4$, $SiHCl_3$, $SiH_2Cl_2$, $SiH_3Cl$, or $PF_3$, or any combination thereof, and (ii) $PCl_3$.

14. The method, as recited in claim 1, wherein the ligand vapor comprises at least one of acetylacetone (acac), hexafluoroacetylacetone (hfac), metal acetylacetonates, and amidines and wherein the volatile chemistry residue cleaning is a plasmaless process.

15. The method, as recited in claim 1, wherein the volatile chemistry residue cleaning phase, comprises:
   flowing a volatile chemistry gas comprising CO, $H_2O$, methanol (MeOH), or formic acid, or any combination thereof, into the plasma processing chamber; and
   forming the volatile chemistry gas into a plasma.

16. The method, as recited in claim 1, wherein the volatile chemistry residue cleaning phase comprises:

flowing a volatile chemistry gas, comprising CO, H$_2$O, NH$_3$, methanol (MeOH), or formic acid, or any combination thereof into the plasma processing chamber; and forming the volatile chemistry gas into a plasma.

17. The method, as recited in claim 1, wherein the oxygen containing gas comprises O$_2$, O$_3$, CO, CO$_2$, or H$_2$O, or any combination thereof.

18. The method, as recited in claim 1, wherein the volatile chemistry residue cleaning phase volatilizes at least one metal containing residue containing at least one of cobalt, iron, palladium, platinum, and iridium.

19. The method, as recited in claim 1, wherein the fluorine containing gas comprises NF$_3$, SF$_6$, or CF$_4$, or any combination thereof.

20. A method for processing a plurality of process wafers in a plasma processing chamber, comprising a plurality of cycles, wherein each cycle comprises:
   a) processing a process wafer of the plurality of process wafers in the plasma processing chamber;
   b) cleaning the plasma processing chamber, comprising:
      i) an oxygen containing plasma phase
      ii) a volatile chemistry residue cleaning phase that removes metal containing residue containing at least one of cobalt, iron, palladium, platinum, and iridium, comprising:
         heating the plasma processing chamber to a temperature of at least 100° C.; and
         flowing a ligand vapor into the plasma processing chamber, wherein the ligand vapor forms a ligand complex with the at least one of cobalt, iron, palladium, platinum, and iridium, wherein the ligand complex vaporizes at a temperature of at least 100° C.; and
      iii) a fluorine containing plasma phase.

21. The method as recited in claim 20, further comprising removing the process wafer from the plasma processing chamber.

22. The method as recited in claim 20, further comprising placing a covering in the plasma processing chamber.

* * * * *